(12) United States Patent
Shibatani et al.

(10) Patent No.: US 10,061,694 B2
(45) Date of Patent: Aug. 28, 2018

(54) MEMORY SYSTEM AND METHOD FOR CONTROLLING NON-VOLATILE MEMORY

(71) Applicant: Toshiba Memory Corporation, Minato-ku, Tokyo (JP)

(72) Inventors: Megumi Shibatani, Yokohama Kanagawa (JP); Akinori Harasawa, Kunitachi Tokyo (JP)

(73) Assignee: Toshiba Memory Corporation, Tokyo (JP)

( * ) Notice: Subject to any disclaimer, the term of this patent is extended or adjusted under 35 U.S.C. 154(b) by 200 days.

(21) Appl. No.: 14/942,733

(22) Filed: Nov. 16, 2015

(65) Prior Publication Data

US 2017/0068488 A1    Mar. 9, 2017

Related U.S. Application Data

(60) Provisional application No. 62/215,098, filed on Sep. 7, 2015.

(51) Int. Cl.
| | |
|---|---|
| *G06F 12/02* | (2006.01) |
| *G06F 11/14* | (2006.01) |
| *G11C 11/56* | (2006.01) |
| *G11C 16/10* | (2006.01) |
| *G11C 16/32* | (2006.01) |

(52) U.S. Cl.
CPC ........ *G06F 12/0246* (2013.01); *G06F 11/141* (2013.01); *G11C 11/5628* (2013.01); *G11C 16/10* (2013.01); *G11C 16/32* (2013.01); *G06F 2212/1032* (2013.01); *G06F 2212/7203* (2013.01); *G11C 2211/5641* (2013.01)

(58) Field of Classification Search
None
See application file for complete search history.

(56) References Cited

U.S. PATENT DOCUMENTS

| | | | | |
|---|---|---|---|---|
| 6,067,248 A | * | 5/2000 | Yoo | G11C 11/5621 365/185.03 |
| 9,570,159 B1 | * | 2/2017 | Wakchaure | G11C 11/5628 |
| 2003/0204776 A1 | * | 10/2003 | Testin | H04N 5/63 714/14 |
| 2006/0044869 A1 | * | 3/2006 | Oyama | G11C 16/12 365/185.03 |

(Continued)

FOREIGN PATENT DOCUMENTS

| | | |
|---|---|---|
| JP | 2009-289014 A | 12/2009 |
| JP | 2010-198252 A | 9/2010 |

*Primary Examiner* — Charles Rones
*Assistant Examiner* — Ryan Dare
(74) *Attorney, Agent, or Firm* — White & Case LLP (57) ABSTRACT

According to one embodiment, a memory system perform a first write operation for writing data to a non-volatile memory by a first write method for writing multi-bit information per memory cell. When a power loss event occurs while the data is written, the memory system calculates a remaining time period required to complete write of an unwritten portion of the data. When the remaining time period is longer than a time period required to write the whole of the data by a second write method for writing one-bit information per memory cell, the memory system performs a second write operation for writing the whole of the data by the second write method in place of the first write operation.

14 Claims, 8 Drawing Sheets

(56) References Cited

U.S. PATENT DOCUMENTS

| | | | |
|---|---|---|---|
| 2011/0060886 A1* | 3/2011 | Warren | G06F 11/1072 |
| | | | 711/171 |
| 2011/0225381 A1 | 9/2011 | Suto et al. | |
| 2015/0039824 A1* | 2/2015 | Furlong | G06F 12/0868 |
| | | | 711/113 |
| 2016/0268000 A1* | 9/2016 | Thompson | G11C 16/30 |

\* cited by examiner

Write command

| Parameter | Description |
|---|---|
| Starting LBA | Starting LBA of data to be written |
| Transfer length | Size of data to be written |
| ⋮ | ⋮ |

MEMORY SYSTEM AND METHOD FOR CONTROLLING NON-VOLATILE MEMORY

CROSS-REFERENCE TO RELATED APPLICATIONS

This application claims the benefit of U.S. Provisional Application No. 62/215,098, filed Sep. 7, 2015, the entire contents of which are incorporated herein by reference.

FIELD

Embodiments described herein relate generally to a technology for controlling a non-volatile memory.

BACKGROUND

Memory systems including a non-volatile memory have recently become widespread.

As one of the memory systems, a solid-state drive (SSD) based on NAND flash technology is known. The SSD is used as a main storage of various computers because it has the features of low power consumption and high performance.

An SSD having a power loss protection (PLP) function includes a backup power source such as a capacitor in order to prevent a data loss due to an unexpected power loss event such as a power failure.

To load the SSD with a large-capacity backup power source becomes factors in increasing costs of the SSD and inhibiting miniaturization of the SSD. It is thus desirable to fulfill a new function of making the capacity of the backup power source as small as possible.

DETAILED DESCRIPTION

Various embodiments will be described hereinafter with reference to the accompanying drawings.

In general, according to one embodiment, a memory system includes a power supply circuit, a non-volatile memory including a plurality of blocks, and a controller. The power supply circuit supplies power to components of the memory system from a backup power source in response to a power loss event. The controller stores data to be written, which is received from a host, in a write buffer temporarily and performs a first write operation for writing the data of the write buffer to a first block of the non-volatile memory by a first write method for writing multi-bit information per memory cell. When a power loss event occurs while the data is written to the first block, the controller calculates a remaining time period required to complete write of an unwritten portion of the data by the first write operation. When the remaining time period is longer than a first time period required to write a whole of the data of the write buffer to the non-volatile memory by a second write method for writing one-bit information per memory cell, the controller performs a second write operation for writing the whole of the data of the write buffer to a second block of the non-volatile memory by the second write method, in place of the first write operation. When the remaining time period is not longer than the first time period, the controller continues the first write operation.

Figure 1:
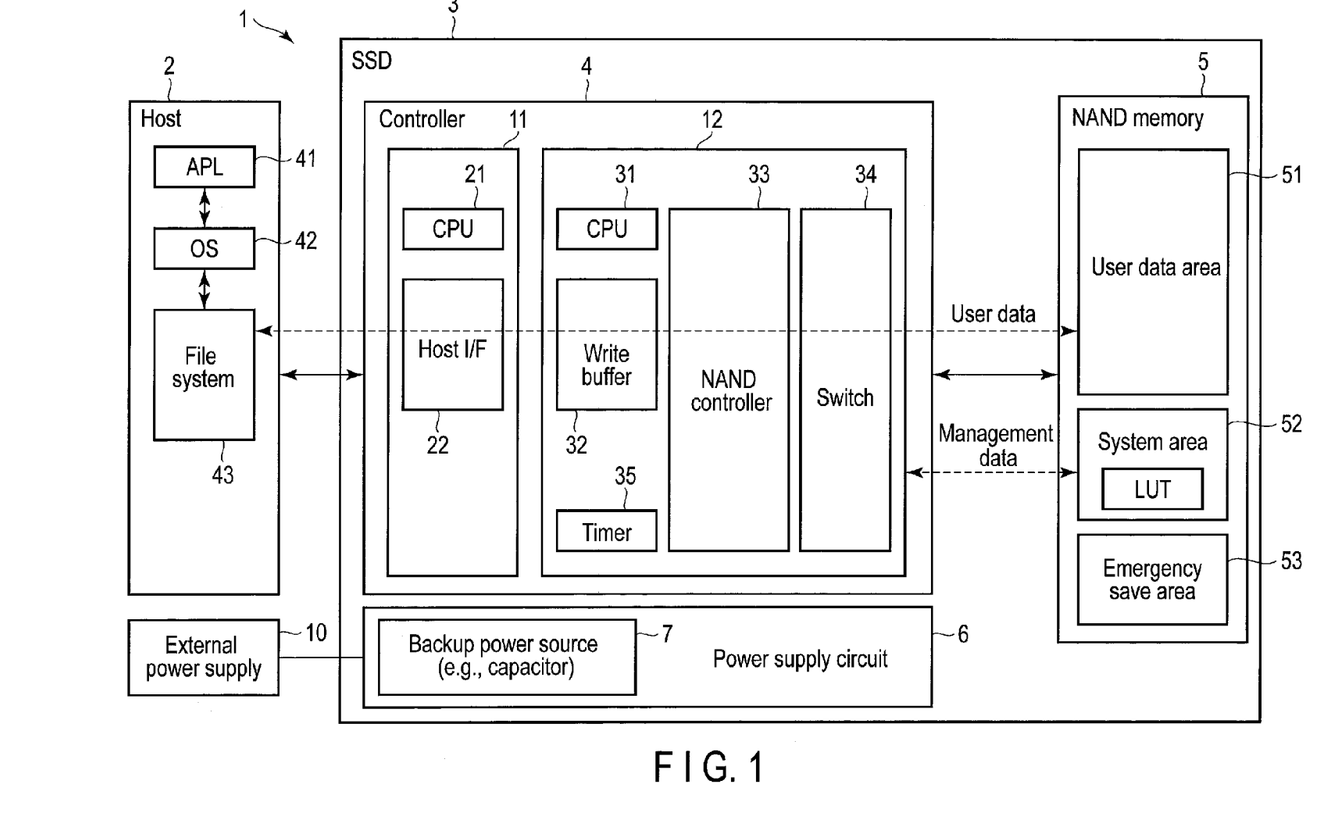
FIG. 1 is a block diagram showing an example of a configuration of a memory system according to an embodiment.

First, a configuration of an information processing system 1 including a memory system according to one embodiment will be described with reference to FIG. 1.

The memory system is a semiconductor storage device configured to write data to a non-volatile memory and read data from the non-volatile memory. The memory device is achieved as a solid-state drive (SSD) 3 based on NAND flash technology, for example.

The information processing system 1 includes a host (host device) 2 and the SSD 3. The host 2 is an information processing apparatus, such as a server and a personal computer.

The SSD 3 can be used as a main storage of an information processing apparatus that serves as the host 2. The SSD 3 can be built in the host 2 (information processing apparatus) or connected to the host 2 (information processing apparatus) via a cable or a network.

As an interface for connecting the host 2 and the SSD 3 to each other, for example, SCSI, Serial Attached SCSI (SAS), ATA, Serial ATA (SATA), PCI Express (PCIe), Ethernet (trademark), Fibre channel and NVM Express (NVMe) can be used.

The SSD 3 includes a controller 4, a non-volatile memory (NAND memory) 5, a power supply circuit 6 and the like. The NAND memory 5 may include a plurality of NAND flash memory chips though it is not limited thereto.

The SSD 3 is achieved as, for example, an enterprise SSD (eSSD) that is favorable for a server computer and the like. The SSD 3 has a power loss protection (PLP) function to prevent a data loss due to an unexpected power loss event such as a power failure. To fulfill the PLP function, the SSD 3 includes a backup power source 7 for supplying backup power. The backup power source 7 may also be referred to as a backup cell. The backup power source 7 can be achieved by a capacitor, a battery or the like.

The power supply circuit 6 switches a power source from an external power supply 10 to the backup power source 7 in response to a power loss event such as a power failure and applies operating power (backup power) to components in the SSD 3 by means of power from the backup power source 7. More specifically, the power supply circuit 6 monitors power applied from the external power supply 10 and detects that a power loss event occurs when the power is shut off without receiving notice to shut down the system from the host 2.

The NAND memory 5 includes a number of NAND blocks (blocks). These blocks serve as an erasure unit. The blocks may also be referred to as "physical blocks" or "erase blocks."

Each of the blocks includes a number of pages (physical pages). In the NAND memory 5, data is read or written in units of pages and data is erased in units of blocks.

The NAND memory 5 is so configured that multi-bit information can be written per memory cell. For example, the NAND memory 5 may be a triple-level cell (TLC)-NAND memory which is so configured that 3-bit information can be written per memory cell or a multilevel cell (MLC)-NAND memory which is so configured that 2-bit information can be written per memory cell. Hereinafter, the NAND memory 5 is assumed to be a TLC-NAND memory though it is not limited thereto.

When the NAND memory 5 is a TLC-NAND memory, a write operation of writing data to a block in the NAND memory 5 is basically performed by a TLC write method for writing 3-bit information per memory cell. In the TLC write method, generally, a plurality of write sequences for writing 3-bit information to a memory cell are carried out. In each of the write sequences, a program operation and a verify operation for confirming a threshold voltage distribution are performed. In the first one of the write sequences, the memory cell is programmed in a state having one of two threshold voltage distributions in accordance with a value of 1-bit information to be written. In the subsequent write sequence, the memory cell is programmed in a state having one of four threshold voltage distributions in accordance with a value of the next 1-bit information to be written. In the write sequence subsequent to the subsequent write sequence, the memory cell is programmed in a state having one of eight threshold voltage distributions in accordance with a value of the last 1-bit information to be written.

The storage area of the NAND memory 5 includes a user data area 51, a system area 52 and an emergency save area 53.

The user data area 51 is used to store user data that can be written and read by the host 2. The user data area 51 includes a number of blocks. A certain block in the user data area 51 is allocated for writing of write data (data to be written) which is received from the host 2. In other words, write data received from the host 2 is written to the allocated blocks.

The system area 52 is used to store management information such as a look-up table (LUT). The look-up table (LUT) is mapping information indicating a correspondence between logical block addresses (LBAs) and physical addresses (physical storage locations on the NAND memory 5). The look-up table (LUT) may also be referred to as an address conversion table.

The TLC write method is applied to the blocks allocated for the user data area 51 and the blocks allocated for the system area 52.

The emergency save area 53 includes some blocks allocated for PLP. Each of these blocks serves as a PLP-dedicated block allocated to save data in response to a power loss event. In this embodiment, a single-level cell (SLC) write method for writing 1-bit information per memory cell is applied to each of the blocks in the emergency save area 53. In other words, the blocks in the emergency save area 53 are SLC blocks to which data is written by the SLC write method.

The controller 4 is electrically coupled to the NAND memory 5. The controller 4 is able to serve as a flash translation layer (FTL) which is configured to perform both data management and block management of the NAND memory 5.

The data management includes (1) management of mapping information representing a correspondence between the logical block addresses (LBAs) and physical addresses, (2) a process for hiding a page-unit read/write and a block-unit erase operation, and the like. The management of mapping between the LBAs and physical addresses is performed using the look-up table (LUT). The physical address corresponding to a certain LBA represents a storage location in the NAND memory 5 to which data of the LBA is written. Data can be written to a page only once per one erasure cycle.

Thus, the controller 4 maps write to the same LBA (overwrite) onto another page on the NAND memory 5. In other words, the controller 4 writes data to another page on the NAND memory 5. Then, the controller 4 updates the look-up table (LUT) to associate the LBA with the page, and invalidate the original page (or old data to which the LBA is associated).

The block management includes management of bad blocks, wear leveling, garbage collection, and the like.

A configuration of the controller 4 will be described below.

The controller 4 includes a front end (FE) unit 11 and a back end (BE) unit 12.

The front end (FE) unit 11 receives a command (a write command, a read command, etc.) from the host 2 and transmits a response to the command to the host 2. The front end (FE) unit 11 may include a CPU 21 and a host interface 22 that is configured to interface with the host 2 under the control of the CPU 21.

The back end (BE) unit 12 executes a process that is required by a command (a write command, a read command, etc.) from the host 2.

The back end (BE) unit 12 includes a CPU 31, a write buffer 32, a NAND controller 33, a switch 34, a timer 35 and the like. The CPU 31 controls components in the back end (BE) unit 12. The write buffer 32 temporarily stores write data (data to be written) that is received from the host 2.

The NAND controller 33 controls the NAND memory 5 under the control of the CPU 31. The switch 34 switches a block to which data (user data) received from the host 2 should be written, from a block in the user data area 51 to a block in the emergency save area 53 when the need arises. The timer 35 measures a degree of progress of a write operation, i.e., a time period from the start to the end (or until a power loss event occurs) of a write operation of writing data of the write buffer 32 to the NAND memory 5.

A configuration of the host 2 will be described below.

The host 2 is an information processing apparatus that executes various programs. The programs executed by the information processing apparatus include an application software layer 41, an operating system 42 and a file system 43.

As is generally known, the operating system (OS) 42 is software configured to manage the host 2 as a whole, control the hardware in the host 2 and perform control for allowing an application to use the hardware and SSD 3.

The file system 43 is used to perform control for operating (creating, saving, updating, deleting, etc.) a file.

Different application software threads run on the application software layer 41. As the application software threads, there are client software, database software, virtual machine and the like.

When the application software layer 41 needs to send a request, such as a read command and a write command, to the SSD 3, it sends the request to the operating system 42. The operating system 42 sends the request to the file system 43. The file system 43 translates the request to a command (a read command, a write command, etc.). The file system 43 sends the command to the SSD 3. Upon receiving a response from the SSD 3, the file system 43 sends the response to the operating system 42. The operating system 42 sends the response to the application software layer 41.

Figure 2:
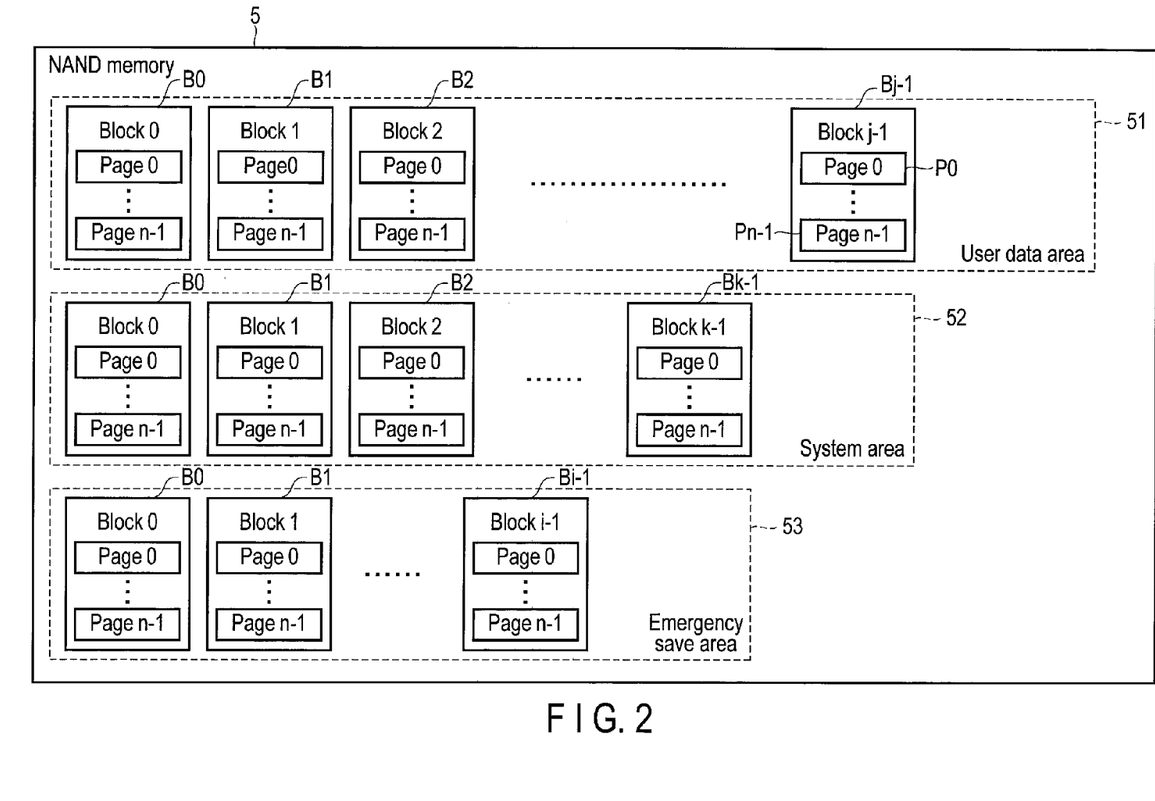
FIG. 2 is a diagram showing an example of a configuration of a non-volatile memory in the memory system of the embodiment.

FIG. 2 shows an example of a configuration of the NAND memory 5.

The user data area 51 includes a number of NAND blocks (blocks) B0 to Bj-1. The blocks B0 to Bj-1 serve as an erasure unit. The blocks may also be referred to as "physical blocks" or "erase blocks." The blocks B0 to Bj-1 include a number of pages (physical pages). Specifically, each of the blocks B0 to Bj-1 includes pages P0 to Pn-1. In the NAND memory 5, data is read or written in units of page and data is erased in units of block. Similarly, the system area 52 includes a plurality of blocks B0 to Bk-1 and the emergency save area 53 includes a plurality of blocks B0 to Bi-1.

A write command process to be performed by the controller 4 will be described with reference to FIGS. 3 and 4.

Figure 3:
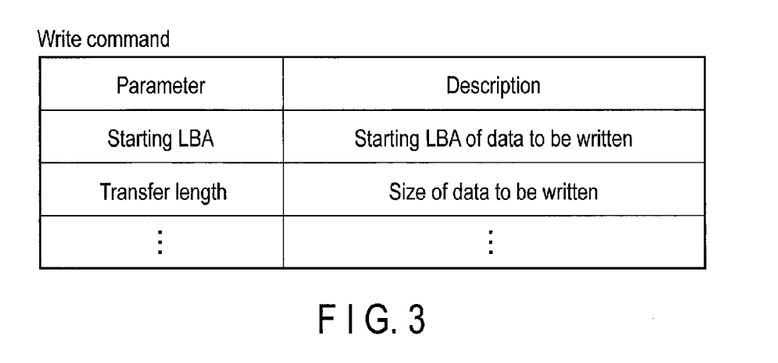
FIG. 3 is an illustration of a write command applied to the memory system of the embodiment.
Figure 4:
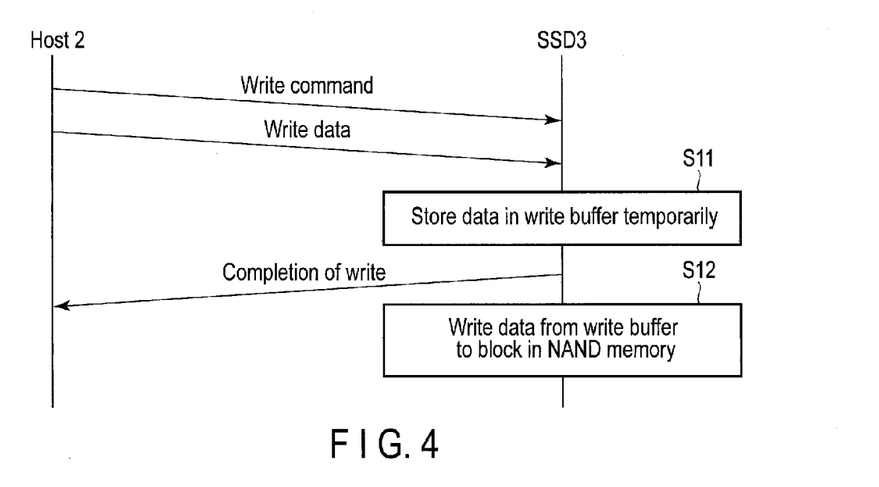
FIG. 4 is an illustration showing a process sequence of a write operation performed by the memory system of the embodiment.

The write command received from the host 2 includes a starting LBA and a transfer length, as shown in FIG. 3. The starting LBA represents a starting logical block address to which write data should be written. The transfer length represents the size of the write data. Upon receiving a write command from the host 2, the controller 4 performs the process sequence shown in FIG. 4.

The host 2 sends the write command and the write data to the SSD 3. The controller 4 temporarily stores the write data received from the host 2 in the write buffer 32 (step S11).

In order to improve the throughput of writing data from the host 2, the controller 4 returns to the host 2 a response indicative of the completion of the data write at a time when the controller 4 stores the write data in the write buffer 32. After that, the controller 4 writes data to a block in the NAND memory 5 from the write buffer 32 (step S12). In order to ensure that the data is reliably written to the NAND memory 5 after the response is returned to the host 2, the foregoing PLP function (e.g., backup power source 7) is required.

Figure 5:
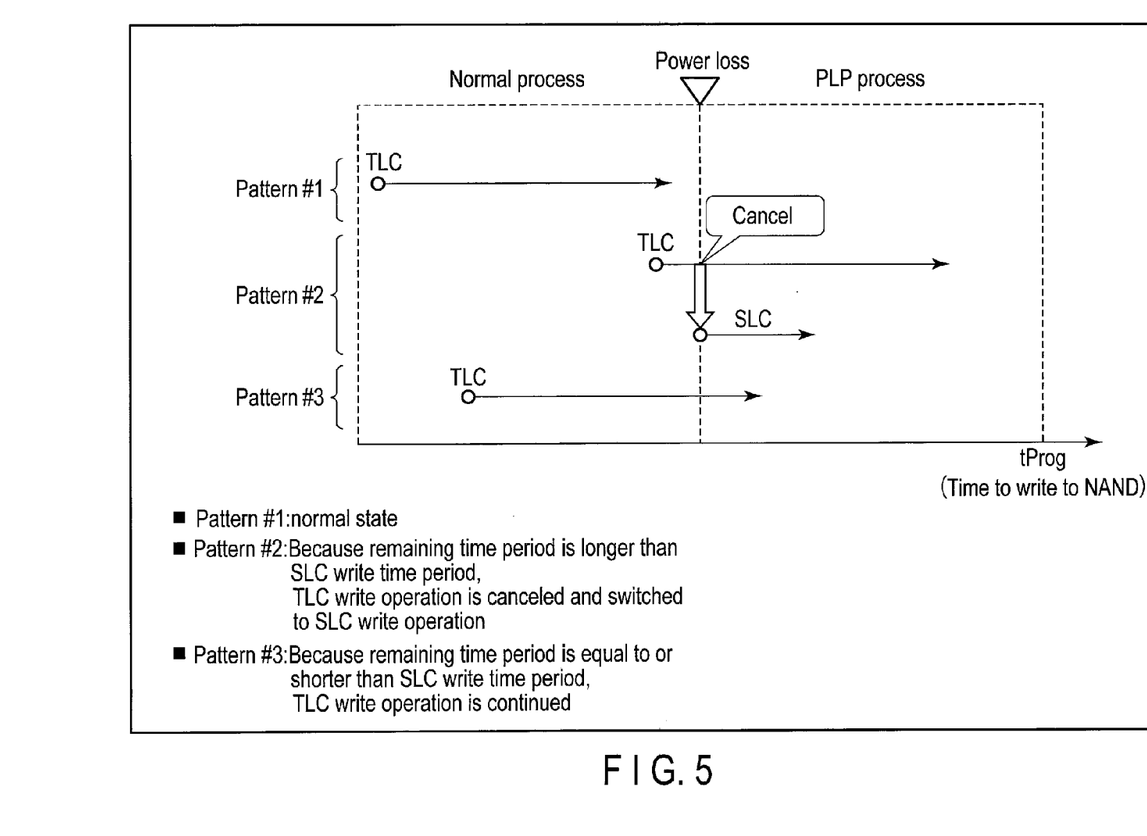
FIG. 5 is an illustration of a write method switching process performed by the memory system of the embodiment.

FIG. 5 illustrates a write method switching process to be performed by the controller 4.

In FIG. 5, pattern #1 represents a write operation to be performed in a normal state. The write data stored in the write buffer 32 is written to a block in the NAND memory 5 by the TLC write method for writing 3-bit information per memory cell.

Figure 6:
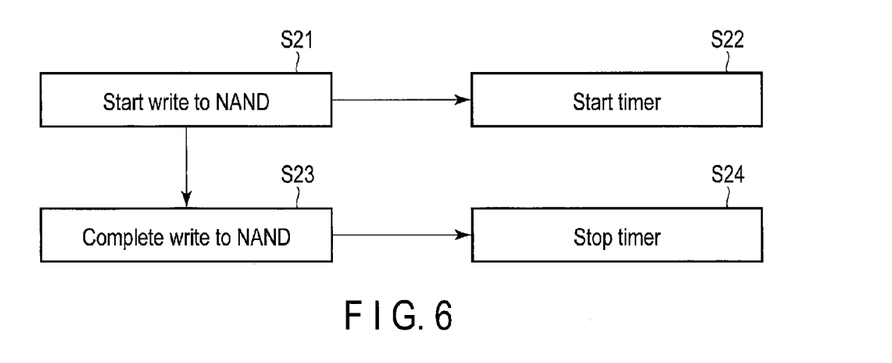
FIG. 6 is a flowchart of steps of a process corresponding to pattern #1, which is performed by the memory system of the embodiment.

In the above write operation, the write control operation shown in the flowchart of FIG. 6 is carried out.

The controller 4 reads write data from the write buffer 32 and starts a write operation (TLC write operation) to write the write data to a block in the NAND memory 5 by the TLC write method (step S21). Then, the controller 4 starts a count operation of the timer 35 (step S22).

In step S21, the write data is transferred from the write buffer 32 to a page buffer in the NAND memory 5 and performs a program operation to write the write data from the page buffer to a page in the block by the TLC write method.

When the write of the whole of the write data to the block in the NAND memory 5 is completed (step S23), the controller 4 stops the timer 35 (step S24).

In general, a time (SLC tProg) required to program data from a page buffer to a memory cell by the SLC write method is much shorter than a time (TLC tProg) required to program data from a page buffer to a memory cell by the TLC write method. In the SLC write method, 1-bit information per memory cell is written by one program operation, whereas in the TLC write method, 3-bit information per memory cell is written by one program operation (program operation of a full sequence). To evaluate a time required to write data of the same amount, therefore, it is necessary to compare SLC tProg×3 and TLC tProg. However, SLC tProg×3 is also much shorter than TLC tProg.

Usually, in a system configured to perform a TLC write operation for data write in a normal state, even though, for example, an unexpected power failure occurs while write data is written to a NAND memory by the TLC write operation, the write method for writing the write data is not switched to a write method other than the TLC write method.

In the PLP function of this embodiment, when a power loss event occurs while write data is written to the NAND memory 5 by the TLC write operation, control for completing write of the write data to the NAND memory 5 in the shortest time is performed. More specifically, the SSD 3 of this embodiment is configured to perform a TLC write operation for data write in a normal state and when, for example, an unexpected power failure occurs while the write data is written to the NAND memory 5 by the TLC write operation, a write method for writing the write data is switched from the TLC write method to the SLC write method when the need arises, and not only unwritten data in the write data but also the whole of the write data is written to another block in the NAND memory 5 by the SLC write method. It is thus possible to shorten a time required from occurrence of a power loss event to completion of write of the write data.

In FIG. 5, pattern #2 represents a process sequence in which a power loss event occurs while write data of the write buffer 32 is written to the NAND memory 5 by the TLC write operation and accordingly the write operation is switched from the TLC write operation to the SLC write operation.

In FIG. 5, pattern #3 represents a process sequence in which a power loss event occurs while write data of the write buffer 32 is written to the NAND memory 5 by the TLC write operation and the TLC write operation is continued.

Figure 7:
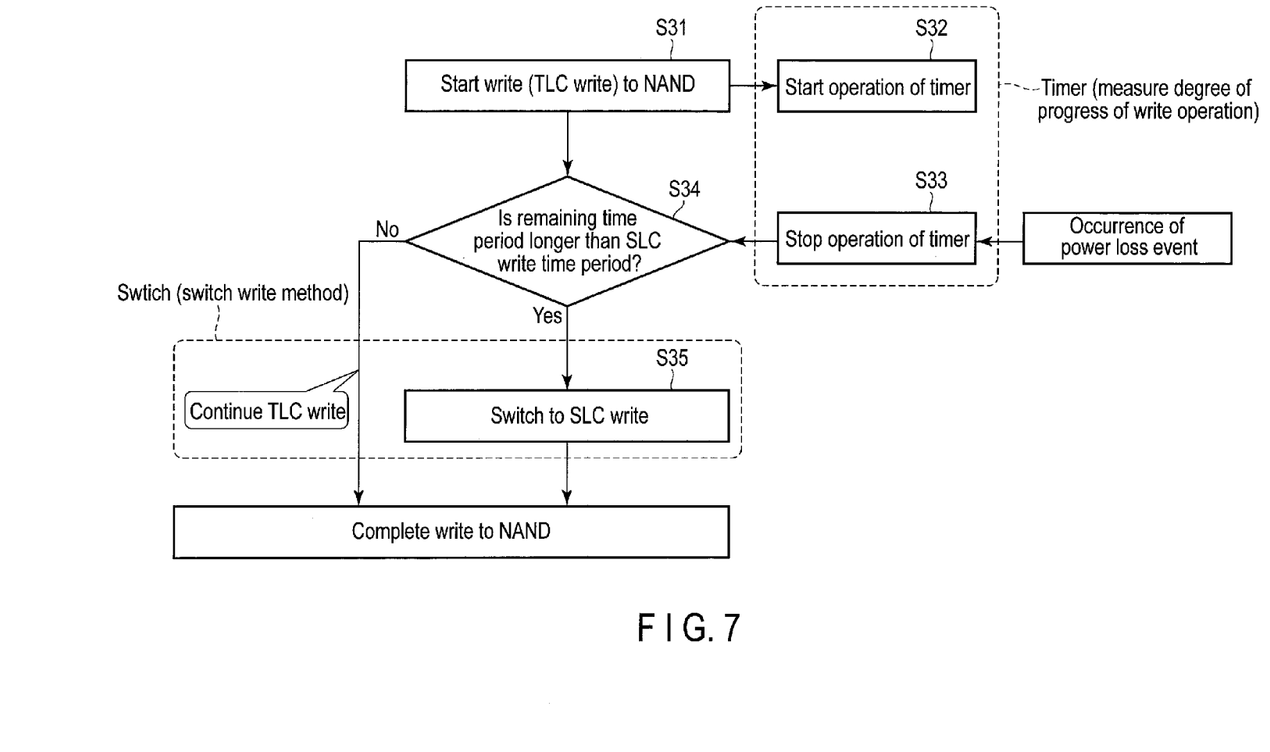
FIG. 7 is a flowchart of steps of processes corresponding to patterns #2 and #3, which are performed by the memory system of the embodiment.

In patterns #2 and #3, the write control operation shown in the flowchart of FIG. 7 is performed.

First, the write control operation in pattern #2 will be described.

(1) The controller 4 starts a TLC write operation (step S31).

(2) The controller 4 starts the timer 35 (step S32).

(3) A power loss event such as a power failure occurs.

(4) The controller 4 stops operation of the timer 35 (step S33).

(5) The controller 4 calculates a remaining time period required to complete the write of an unwritten portion of write data by the TLC write operation. The remaining time period can be calculated by subtracting a time period (a measured value of the timer) from the start of the TLC write operation to the occurrence of the power loss event, from a time period required to write the whole of the write data of the write buffer 32 to the NAND memory 5 by the TLC write operation. In pattern #2, the remaining time period is longer than a time period (SLC write time period) required to rewrite the whole of the write data of the write buffer 32 to a block in the save area of the NAND memory 5 by the SLC write method (Yes in step S34) and thus the controller 4 stops (cancels) the TLC write operation and starts an SLC write operation in place of the TLC write operation (step S35).

(6) The write of the whole of the write data is completed.

Next, the write control operation in pattern #3 will be described.

(1) The controller 4 starts a TLC write operation (step S31).

(2) The controller 4 starts the timer 35 (step S32).

(3) A power loss event such as a power failure occurs.

(4) The controller 4 stops operation of the timer 35 (step S33).

(5) The controller 4 calculates a remaining time period. The remaining time period is not longer than an SLC write time period (No in step S34); thus, the controller 4 continues performing the TLC write operation.

(6) The write of the whole of the write data is completed.

Figure 8:
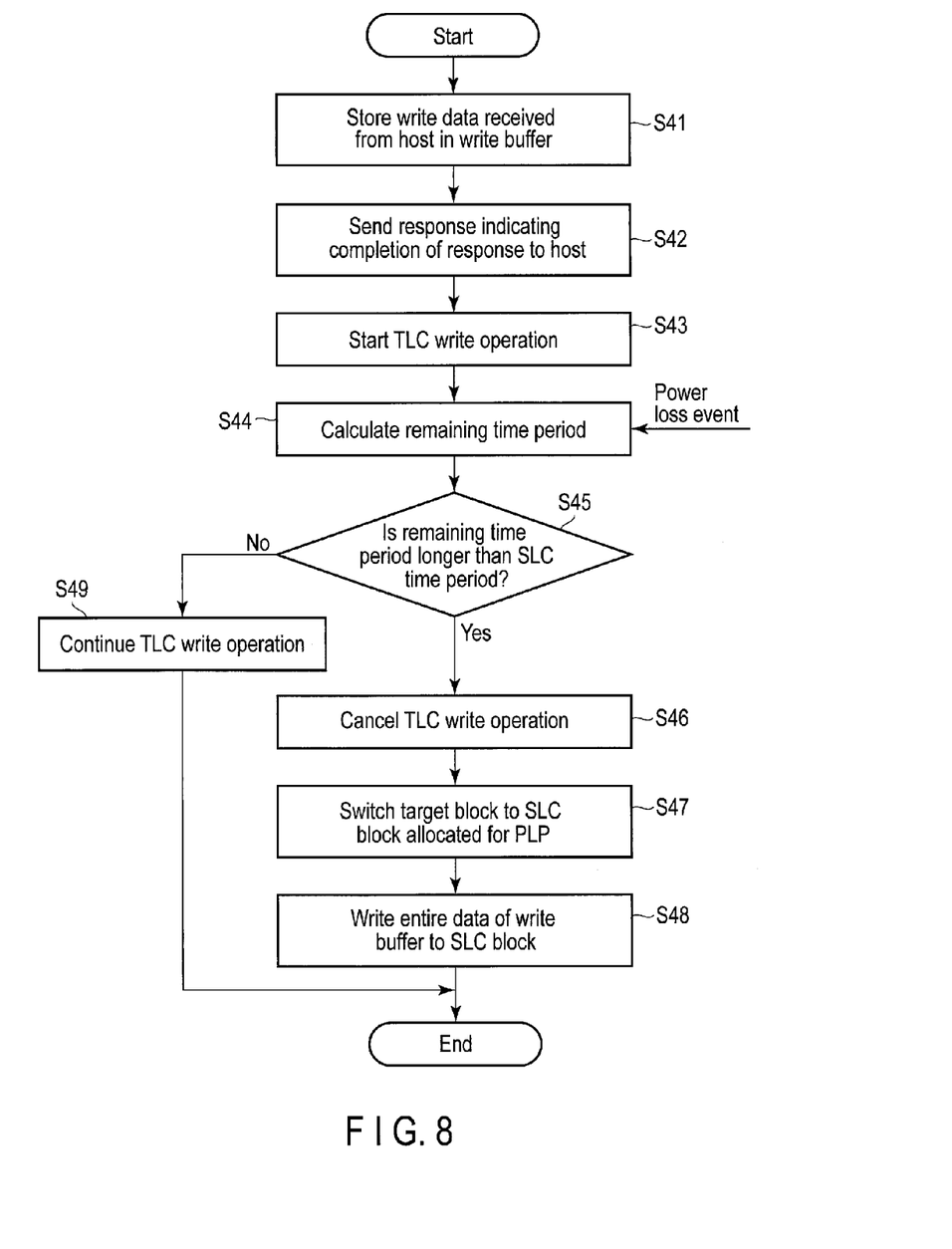
FIG. 8 is a flowchart showing a series of steps executed by the memory system of the embodiment.

A flowchart of FIG. 8 shows a series of steps executed by the controller 4 in response to a write command received from the host 2.

The controller 4 receives from the host 2 write data (data to be written) of a size designated by the transfer length in the write command and stores the write data in the write buffer 32 temporarily (step S41). When the write data is stored in the write buffer 32, the controller 4 returns to the host 2 a response indicating completion of write of the write data, i.e., a response indicating completion of the write command (step S42).

The controller 4 uses the NAND controller 33 to start a TLC write operation for writing the write data of the write buffer 32 to an allocated block in the user data area 51 of the NAND memory 5 (step S43). In step S43, the controller 4 performs a process to start the timer 35.

If a power loss event occurs while write data is written to the block by the TLC write operation, the controller 4 calculates a remaining time period required to complete the write of an unwritten portion of the write data by the TLC write operation (step S44). In step S44, the controller 4 calculates the remaining time period by subtracting a measured value of the timer 35 from the total TLC write time period required to write the whole of the write data by the TLC write operation.

The total TLC write time period can be estimated on the basis of a function of the size of the write data as a whole and the TLC tProg described above.

The remaining time period can also be calculated from the amount of the unwritten portion of the write data and the TLC tProg and, in this case, a complicated process may be required to measure the amount of the unwritten portion correctly.

In this embodiment, the remaining time period can easily be obtained by subtracting a timer value (a time period from the start of the TLC write operation to the power loss event) from the total TLC write time period.

The controller 4 compares the remaining time period with the SLC write time period (a time period required to rewrite the whole of the write data of the write buffer 32 to a block in the saving area of the NAND memory 5 by the SLC write method) (step S45). The SLC write time period (total SLC write time period) can be estimated on the basis of a function of the size of the write data as a whole and the SLC tProg described above.

If the remaining time period is longer than the SLC write time period (Yes in step S45), the controller 4 determines that the write of write data can be completed more quickly when the current TLC write operation is switched to the SLC write operation than when the current TLC write operation is continued, and cancels (stops) the current TLC write operation (step S46). The controller 4 switches a block to be written to a block in the emergency save area 53 from the allocated block in the user data area 51 by the switch 34 (step S47). Then, the controller 4 uses the NAND controller 33 to start the SLC write operation for writing the whole of the write data of the write buffer 32 to a block (SLC block) in the emergency save area 53 by the SLC write method (step S48). Accordingly, the whole of the write data designated by a write command is written to the block in the emergency save area 53.

If the remaining time period is not longer than the SLC write time period (No in step S45), the controller 4 determines that the write of write data can be completed more quickly when the current TLC write operation is continued than when the current TLC write operation is switched to the SLC write operation, and continues the current TLC write operation (step S49).

If the control according to the flowchart shown in FIG. 8 is performed, when a power loss event occurs while write data is written to the NAND memory 5 by the TLC write operation, the write of the write data to the NAND memory 5 can be completed in the shortest time.

With respect to another write data of the write buffer 32, whose write to the NAND memory 5 starts after a power loss event occurs, the controller 4 may select the SLC write operation unconditionally and write the write data to a block in the emergency save area 53 by the SLC write operation.

Figure 9:
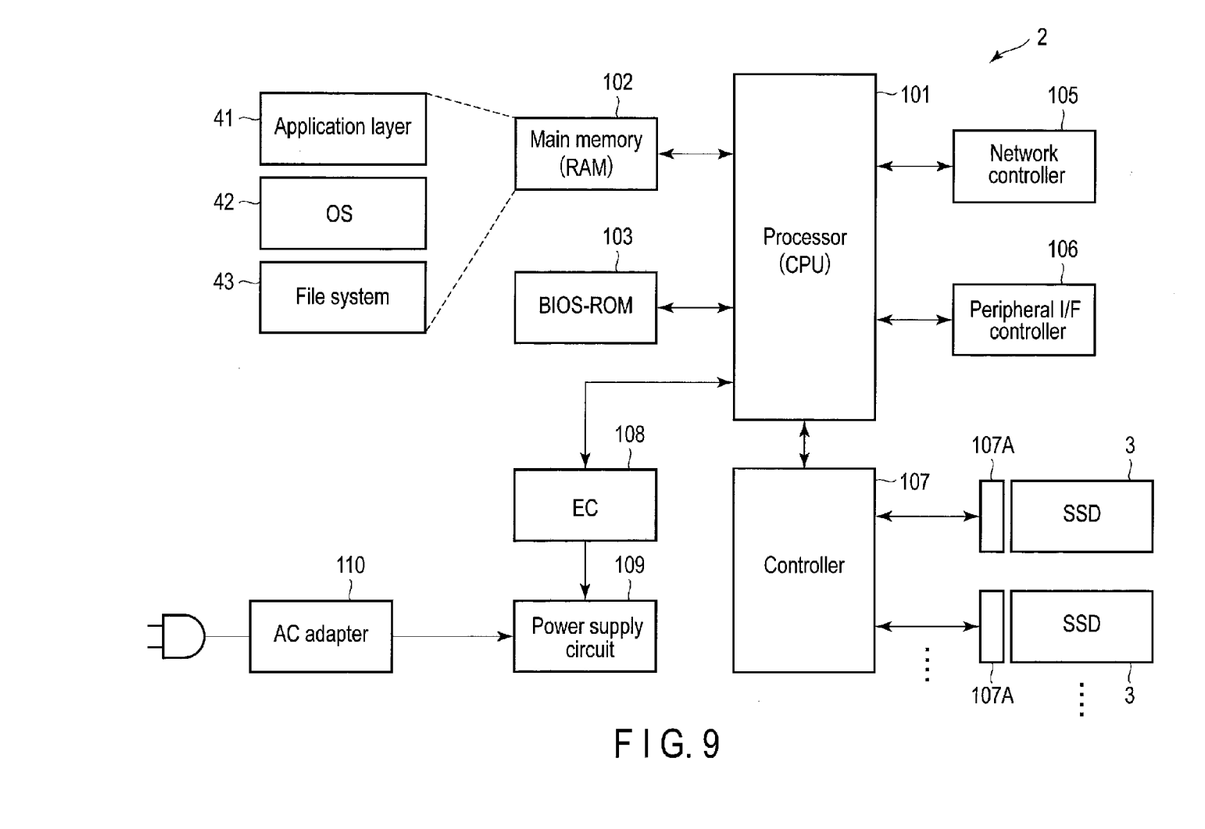
FIG. 9 is a block diagram showing an example of a configuration of a host to which the memory system of the embodiment is applied.

FIG. 9 shows an example of a hardware configuration of an information processing apparatus that serves as the host 2.

The information processing apparatus is achieved as a server computer or a personal computer. The information processing apparatus includes a processor (CPU) 101, a main memory 102, a BIOS-ROM 103, a network controller 105, a peripheral interface controller 106, a controller 107, an embedded controller (EC) 108, a power supply circuit 109 and the like.

The processor 101 is a CPU configured to control the operation of each component of the information processing apparatus. The processor 101 executes various programs which are loaded in the main memory 102 from one of a plurality of SSDs 3. The main memory 102 is configured by a random access memory such as a DRAM. The programs executed by the processor 101 include the foregoing application software layer 41, operating system 42 and file system 43.

The processor 101 also executes a basic input/output system (BIOS) stored in the BIOS-ROM 103 that is a non-volatile memory. The BIOS is a system program for controlling hardware.

The network controller 105 is a communication device such as a wired LAN controller and a wireless LAN controller. The peripheral interface controller 106 is configured to communicate with a peripheral device such as a USB device.

The controller 107 is configured to communicate with a device connected to each of a plurality of connectors 107A. In this embodiment, the SSDs 3 are connected to their respective connectors 107A. The controller 107 is an SAS expander, a PCIe switch, a PCIe expander, a flash array controller, a RAID controller or the like.

The EC 108 serves as a system controller configured to manage the power of the information processing apparatus. The EC 108 turns on and off the information processing apparatus in accordance with a user's operation of a power switch in cooperation with the power supply circuit 109. The EC 108 is achieved as a processing circuit such as a one-chip microcontroller. The EC 108 includes a keyboard controller to control an input device such as a keyboard (KB). The power supply circuit 109 generates operating power to be applied to the components and SSDs 3 in the information processing apparatus using power applied from an AC adapter 110.

Figure 10:
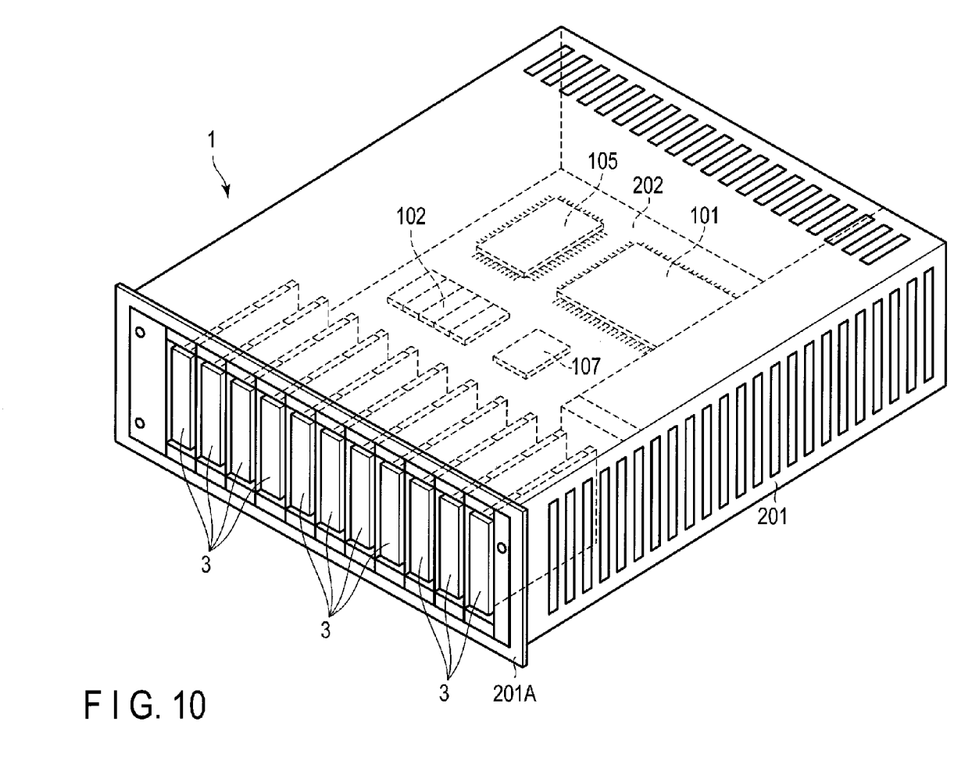
FIG. 10 is a diagram showing an example of a configuration of a computer including the host and the memory system of the embodiment.

FIG. 10 shows an example of a configuration of an information processing apparatus including a host 2 and a plurality of SSDs 3.

The information processing apparatus includes a thin box-shaped housing 201 that can be housed in a rack. The SSDs can be arranged in the housing 201 and, in this case, the SSDs 3 can detachably be inserted in slots formed in a front 201A of the housing 201.

A system board (mother board) 202 is placed in the housing 201. On the system board (mother board) 202, different electronic components including a CPU 101, a memory 102, a network controller 105 and a controller 107 are mounted. These electronic components serve as the host 2.

As described above, according to the embodiment, when an unexpected power loss event occurs while write data is written by the TLC write operation, it is determined whether the TLC write operation is continued or it is switched to the SLC write operation according to a remaining time period required to complete the write of an unwritten portion of the write data by the TLC write operation and an SLC write time period required to rewrite the whole of the write data of the write buffer 32. It is thus possible to shorten a time required from occurrence of a power loss event to completion of write of the write data whose write operation is in progress. Accordingly, it is possible to reduce the capacity of a backup power source 7 that needs to be mounted on its corresponding SSD 3 for PLP.

In the foregoing embodiment, a memory system that performs a TLC write operation to write data in a normal state is described. However, the embodiment can be applied to a memory system that performs an MLC write operation to write data in a normal state.

In the foregoing embodiment, a NAND memory is described as an example of a non-volatile memory. However, the function of the embodiment can be applied to various non-volatile memories, such as a magnetoresistive random access memory (MRAM), a phase change random access memory (PRAM), a resistive random access memory (ReRAM) and a ferroelectric random access memory (FeRAM).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a power supply circuit configured to supply power to components of the memory system from a backup power source in response to a power loss event;
a write buffer;
a non-volatile memory including a plurality of blocks; and
a controller configured to store data to be written, which is received from a host, in the write buffer temporarily and perform a first write operation for writing the data in the write buffer to a first block of the non-volatile memory by a first write method for writing multi-bit information per memory cell,
wherein the controller is configured to:
calculate a remaining time period required to complete write of an unwritten portion of the data in the write buffer by the first write operation when a power loss event occurs;
perform a second write operation for writing a whole of the data in the write buffer to a second block of the non-volatile memory by a second write method for writing one-bit information per memory cell, in place of the first write operation when the remaining time period is longer than a first time period required to write the whole of the data in the write buffer to the non-volatile memory by the second write method; and
continue the first write operation when the remaining time period is not longer than the first time period.

2. The memory system of claim 1, wherein the first block is a block allocated for writing of data to be written, which is received from the host, and the second block is a block allocated to save data in response to the power loss event.

3. The memory system of claim 1, wherein the first write method is a write method for writing 3-bit information per memory cell.

4. The memory system of claim 1, wherein the controller is configured to calculate the remaining time period by subtracting a time period from start of the first write operation to occurrence of the power loss event from a time period required to write the whole of the data in the write buffer to the non-volatile memory by the first write method.

5. The memory system of claim 4, wherein the controller comprises a timer configured to measure the time period from start of the first write operation to occurrence of the power loss event.

6. The memory system of claim 1, wherein the controller is configured to return a response indicating completion of write of the data to the host in response to storage of the data in the write buffer.

7. The memory system of claim 1, wherein the controller is configured to switch a block to which the data is to be written from the first block to the second block when the remaining time period is longer than the first time period.

8. A method of controlling a memory system comprising a non-volatile memory, a write buffer, and a power supply circuit configured to supply power to components of the memory system from a backup power source in response to a power loss event, the method comprising:
storing data to be written, which is received from a host, in the write buffer temporarily;
performing a first write operation for writing the data in the write buffer to a first block of the non-volatile memory by a first write method for writing multi-bit information per memory cell;
calculating a remaining time period required to complete write of an unwritten portion of the data in the write buffer by the first write operation when a power loss event occurs;

performing a second write operation for writing a whole of the data in the write buffer to a second block of the non-volatile memory by a second write method for writing one-bit information per memory cell, in place of the first write operation when the remaining time period is longer than a first time period required to write the whole of the data in the write buffer to the non-volatile memory by the second write method; and continuing the first write operation when the remaining time period is not longer than the first time period.

9. The method of claim 8, wherein the first block is a block allocated for writing of data to be written, which is received from the host, and the second block is a block allocated to save data in response to the power loss event.

10. The method of claim 8, wherein the first write method is a write method for writing 3-bit information per memory cell.

11. The method of claim 8, wherein the calculating the remaining time period comprises subtracting a time period from start of the first write operation to occurrence of the power loss event from a time period required to write the whole of the data in the write buffer to the non-volatile memory by the first write method in order to calculate the remaining time period.

12. The method of claim 11, wherein the time period from start of the first write operation to occurrence of the power loss event is measured by a timer in the memory system.

13. The method of claim 8, further comprising returning a response indicating completion of write of the data to the host in response to storage of the data in the write buffer.

14. The method of claim 8, further comprising switching a block to which the data is to be written from the first block to the second block when the remaining time period is longer than the first time period.

* * * * *